(12) United States Patent
Jung et al.

(10) Patent No.: US 7,108,957 B2
(45) Date of Patent: Sep. 19, 2006

(54) ORGANIC ANTI-REFLECTIVE COATING COMPOSITION AND METHOD FOR FORMING PHOTORESIST PATTERNS USING THE SAME

(75) Inventors: Jae-chang Jung, Seoul-shi (KR); Ki-soo Shin, Seongnam-shi (KR)

(73) Assignee: Hynix Semiconductor Inc., (KR)

( * ) Notice: Subject to any disclaimer, the term of this patent is extended or adjusted under 35 U.S.C. 154(b) by 248 days.

(21) Appl. No.: 10/619,254

(22) Filed: Jul. 14, 2003

(65) Prior Publication Data

US 2004/0018346 A1    Jan. 29, 2004

(30) Foreign Application Priority Data

Jul. 18, 2002    (KR) ...................... 10-2002-0042071

(51) Int. Cl.
*G03F 7/032* (2006.01)
*G03F 7/11* (2006.01)
*G03F 7/038* (2006.01)
*C08K 5/54* (2006.01)

(52) U.S. Cl. ............................... 430/270.1; 430/272.1; 430/905; 430/914; 430/927; 106/481; 524/267

(58) Field of Classification Search ............. 430/270.1, 430/272.1, 905, 914, 927; 106/481; 524/269
See application file for complete search history.

(56) References Cited

U.S. PATENT DOCUMENTS

| 5,935,765 A | 8/1999 | Tanaka et al. .............. 430/315 |
| 6,162,588 A | 12/2000 | Tanaka et al. .............. 430/318 |
| 6,309,790 B1 | 10/2001 | Jung et al. ................ 430/270.1 |
| 6,388,039 B1 | 5/2002 | Jung et al. ................ 526/329.6 |
| 6,716,566 B1 * | 4/2004 | Aoshima .................. 430/273.1 |
| 6,835,532 B1 * | 12/2004 | Jung ....................... 430/271.1 |
| 2004/0152860 A1 * | 8/2004 | Ogata et al. ................... 528/35 |
| 2004/0219454 A1 * | 11/2004 | Foster et al. ............. 430/270.1 |
| 2005/0090605 A1 * | 4/2005 | Park et al. .................. 524/556 |

FOREIGN PATENT DOCUMENTS

| EP | 1 237 042 A2 | 9/2002 |
| WO | WO 00/01752 A1 | 1/2000 |

\* cited by examiner

*Primary Examiner*—Richard L. Schilling
(74) *Attorney, Agent, or Firm*—Marshall, Gerstein & Borun LLP

(57) ABSTRACT

The present disclosure relates to an organic anti-reflective coating composition and a method for forming photoresist patterns using the same. The anti-reflective coating compositions are useful for preventing reflection of a lower film layer or a substrate of a photoresist film, reducing standing waves caused by light and variations in the thickness of the photoresist itself, and increasing the uniformity of the photoresist patterns. More particularly, the present invention relates to an organic anti-reflective coating composition comprising particular organo-silicon based polymers and a method for forming photoresist patterns using the same. The organic anti-reflective coating composition can prevent excessive absorbency of an anti-reflective film formed therefrom and, thus, minimize the reflectivity of the film so that it can efficiently remove standing waves and increase the uniformity of the photoresist pattern.

11 Claims, No Drawings

ORGANIC ANTI-REFLECTIVE COATING COMPOSITION AND METHOD FOR FORMING PHOTORESIST PATTERNS USING THE SAME

BACKGROUND OF THE DISCLOSURE

1. Field of the Disclosure

The present disclosure relates to organic anti-reflective coating compositions and methods for forming photoresist patterns using the same. More particularly, the present disclosure relates to organic anti-reflective coating compositions comprising organo-silicon based polymers and methods for forming photoresist patterns using the same.

2. Description of the Related Art

Standing waves are often generated during microfine photoresist pattern-forming processes and conventional semiconductor production methods. Standing waves are generated because of the optical properties of a lower film layer (such as, for example, the substrate of a photoresist film) and/or because the thickness of the photoresist film is not uniform (i.e., it is varied). Standing waves derived from light diffracted and/or reflected from the substrate cause reflective notching and/or varying of the critical dimension (hereinafter referred to as "CD") of the photoresist pattern. Accordingly, layers which prevent light from reflecting off of the substrate have been introduced between the substrate and the photoresist. Such layers are called anti-reflective films, and typically comprise materials having a high quality light-absorbing ability within a wavelength range of an exposure light source. Anti-reflective films may generally be classified into inorganic and organic based anti-reflective films.

Organic anti-reflective films have been widely used in microfine photoresist pattern-forming processes. Organic anti-reflective films typically possess the following properties:

(1) After the anti-reflective film is formed and while a photoresist comprising a photosensitive material is coated or otherwise applied onto the anti-reflective film, the anti-reflective film should not dissolve (i.e., it is not soluble) in the photoresist solvent. For this reason, organic anti-reflective films generally have cross-linked structures (which are generated by conducting a baking process). Such cross-linked structures also inhibit the generation of undesirable chemical by-products;

(2) In order to prevent the scattered reflection of light from the substrate, the film contains certain materials to absorb light within a wavelength range of an exposure light source; and, (3) The anti-reflective coating composition includes a particular catalyst to activate the cross-linking reaction.

Thus, conventional organic anti-reflective coating compositions generally comprise a cross-linking agent for generating the desired cross-linked anti-reflective film structure, a light-absorbing agent for absorbing light within a wavelength range of an exposure light source, and a thermal acid generator as a catalyst for activating the cross-linking reaction.

Although anti-reflective films preferably have a high absorbance for absorbing light and inhibiting the reflection of light from the substrate as described above, the absorbance is not always directly proportionate to the reflectance. On the contrary, excessively high light absorbance may cause the amount of light which penetrates through the anti-reflective film to decrease and lead to an increase in the reflectance of the anti-reflective film such that it may be difficult to efficiently reduce the standing waves and obtain a quality photoresist pattern. Thus, the absorbance of organic anti-reflective films preferably ranges between about 0.3 and about 0.6.

Most organic materials generally contained in conventional organic anti-reflective coating compositions have an absorbance of more than 0.7 with respect to a 157 nm $F_2$ light source. Accordingly, organic anti-reflective films formed from such compositions show excessively high absorbance with respect to the 157 nm light source and, in the case of a microfine pattern-forming process using a 157 nm $F_2$ light source, the standing waves cannot be reduced such that quality photoresist patterns can be obtained.

Due to the problems of existing organic anti-reflective compositions noted above, improved organic anti-reflective coating compositions are needed to efficiently remove standing waves and for providing stable photoresist patterns.

SUMMARY OF THE DISCLOSURE

The present disclosure provides organic anti-reflective coating compositions comprising organo-silicon based polymers. The coating compositions prevent the absorption of the anti-reflective film from being too high so that it can efficiently remove the standing waves and form quality photoresist patterns.

The present disclosure also provides methods for forming a photoresist pattern using the organic anti-reflective coating compositions disclosed herein. The disclosed methods may be used in microfine photoresist pattern-forming processes with light source, particularly a 157 nm $F_2$ light source, to obtain perpendicular photoresist patterns.

According to one aspect of the disclosure, an organic anti-reflective coating composition comprises a cross-linking agent, a light-absorbing agent having a high absorbency within a wavelength range of an exposure light source, a thermal acid generator, an organic solvent, and a polydimethylsiloxane polymer.

According to another aspect of the disclosure, a method for forming a photoresist pattern comprises the steps of applying an organic anti-reflective coating composition comprising a cross-linking agent, a light-absorbing agent having a high absorbency within a wavelength range of an exposure light source, a thermal acid generator, an organic solvent, and a polydimethylsiloxane polymer, onto the surface of a layer to be etched to form a coating, conducting a baking process on the coating to generate cross-linking therein and form an organic anti-reflective film, applying a photosensitive material onto the anti-reflective film to form a photoresist, exposing the photoresist to a light source to form an exposed photoresist, and developing the exposed photoresist to form the photoresist pattern.

DETAILED DESCRIPTION OF THE DISCLOSURE

According to one aspect of the disclosure, an organic anti-reflective coating composition comprises a cross-linking agent, a light-absorbing agent having a high absorbency within a wavelength range of an exposure light source, a thermal acid generator, an organic solvent, and an organo-silicon polymer.

The organo-silicon polymer may comprise a polydimethylsiloxane. Suitable polydimethylsiloxanes have a low absorbance at 157 nm (about 0.1 or less). The polydimethylsiloxanes can have a weight average molecular weight ranging between about 14,000 grams per mol (g/mol) and about 21000 g/mol (e.g., see The Merck Index, 12th edition, pp.544 to 545) and a structure in accordance with formula 1.

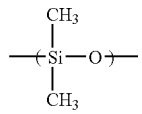
(Formula 1)

The organo-silicon polymer (e.g., polydimethylsiloxane) content of the anti-reflective compositions minimizes the reflectance of a film formed therefrom. The anti-reflective coating compositions have a preferred light-absorbency at 157 nm ranging between about 0.3 and about 0.6, which allows the compositions to effectively remove standing waves and form favorable photoresist patterns.

Ranges can be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," the particular value forms another embodiment.

The organic anti-reflective coating compositions may contain a light-absorbing agent. Preferably, the light-absorbing agent comprises a polyvinyl phenol polymer having a structure in accordance with formula 2. Such polyvinyl phenol polymers have a high light-absorbance at 157 nm and contain hydroxyl groups for reacting with a cross-linking agent to generate a cross-linked structure (i.e., the film comprises cross-linked covalent bonds), which will not dissolve in the photoresist solvent.

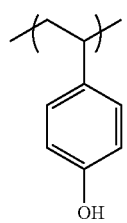
(Formula 2)

The compositions also contain a cross-linking agent or the like. Such cross-linking agents typically have a light-absorbency at 157 nm greater than 0.7. The cross-linking agent may comprise acetal based compounds, more preferably, acetal polymers having a structure in accordance with formula 3. Such acetal polymers typically have a weight average molecular weight ranging from about 3000 g/mol to about 100,000 g/mol, and are suitable for cross-linking with a light-absorbing agent, such as polyvinyl phenol, typically contained in the anti-reflective coating compositions.

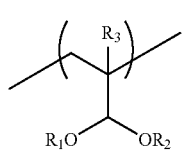
(Formula 3)

In formula 3, $R_1$ and $R_2$ are each independently branched and or straight chain $C_1$–$C_{10}$ alkyl group, substituted or unsubstituted, and $R_3$ is a hydrogen or methyl group.

Such acetal based compounds react with a light-absorbing agent (e.g., polyvinyl phenol) to form cross-linked covalent bonds in the formed organic anti-reflective films. Consequently, the disclosed anti-reflective films do not dissolve in the photoresist solvent.

The acetal polymers can be obtained by polymerizing (meth)acroleins to prepare poly(meth)acroleins, and reacting the resulting materials with a branched chain and/or straight chain, substituted or unsubstituted, $C_1$–$C_{10}$ alkyl alcohol. Such polymers and methods for the preparation of the same have been disclosed in Korean Patent Applications No. 99-61343 (laid-open on Jul. 5, 2001) and No. 99-61344 (laid-open on Jul. 5, 2001).

The anti-reflective coating compositions generally include a thermal acid generator. The thermal acid generator is a catalyst for activating the cross-linking reaction between the cross-linking agent and the light-absorbing agent. According to one aspect of the disclosure, the thermal acid generator comprises 2-hydroxycyclohexyl p-toluene-sulfonate, which has a structure in accordance with formula 4:

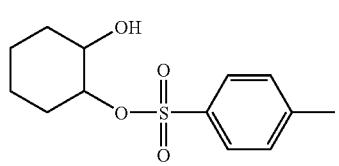
(Formula 4)

An organic anti-reflective film which does not dissolve in the photoresist solvent can be formed by first coating or otherwise applying an anti-reflective coating composition including a thermal acid generator on the wafer of semiconductor device and/or element. A heating process such as baking is then conducted to produce acid from the thermal acid generator and, in turn, induce the cross-linking reaction described above.

In the organic anti-reflective coating compositions of the present disclosure, the light-absorbing agent (e.g., the polyvinyl phenol polymer of formula 1) may be preferably contained in an amount of about 50 weight percent (wt. %) to about 400 wt. %, based on the total amount of cross-linking agent included in the present composition. The thermal acid generator is preferably contained in an amount of about 10 wt. % to about 200 wt. % relative to the amount of cross-linking agent. In addition, the organic solvent is preferably contained in an amount of about 1000 wt. % to about 10,000 wt. %, based on the total amount of cross-linking agent and light-absorbing agent included in the present composition. The organo-silicon polymer, e.g., polydimethylsiloxane, is preferably in an amount of about 20 wt. % to about 100 wt. % relative to the total amount of cross-linking agent and light-absorbing agent included in the composition.

Coating compositions containing an organo-silicon polymer such as polydimethylsiloxane in the amount described above provide an anti-reflective film formed therefrom with an optimal light-absorbency range at 157 nm, i.e., an absorbency suitable for efficiently removing standing waves caused by substrate reflection.

By comprising the respective components described above, the organic anti-reflective coating composition of the present disclosure can efficiently protect the lower film layer (i.e., the substrate of the photoresist film) from scattered reflection. At the same time, the disclosed anti-reflective coating compositions prevent undercutting of the substrate, and thereby result in high quality perpendicular photoresist patterns.

In another embodiment of the present disclosure, the organic anti-reflective coating composition may additionally comprise an acid-diffusion inhibitor. According to one aspect of the disclosure, the acid-diffusion inhibitor may comprise a crown ether based compound such as, 18-crown-6(1,4,7,10,13,16-hexaoxacyclooctadecane), which has a structure in accordance with formula 5;

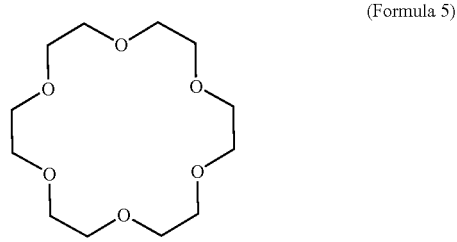

(Formula 5)

Crown ether based compounds have a crown-like circular structure (as represented in formula 5) and contain oxygen atoms within such a circular structure. The oxygen atoms contained in such a compound may optionally interact with certain cations in the organic solvent matching the size of cavity in the center portion of the circular structure. When such a crown ether compound is added to the coating compositions of the present disclosure, the compositions can prevent acid-diffusion toward the lower portion of the photoresist, and undercutting caused by the same, even when acid is generated during the formation of the photoresist pattern. Thus, a quality perpendicular photoresist pattern can be obtained.

The acid-diffusion inhibitors are preferably contained in an amount of about 30 mol % to about 500 mol % relative to the amount of the thermal acid generator included in the composition (i.e., the molar ratio of acid-diffusion inhibitor to thermal acid generator is between about 0.30 and about 5.0).

In another aspect of the present disclosure, a method for forming photoresist patterns comprises the steps of applying an organic anti-reflective coating composition in accordance with the present disclosure onto the surface of a layer to be etched to form a coating, conducting a baking process on the coating to generate cross-linking therein to form an organic anti-reflective film, applying a photosensitive material onto the anti-reflective film to form a photoresist, exposing the photoresist to a light source to form an exposed photoresist, and developing the exposed photoresist to form desirable photoresist patterns.

Since the above photoresist pattern-forming method of the present disclosure uses a coating composition containing an organo-silicon polymer such as polydimethylsiloxane, an anti-reflective film formed therefrom may have a light-absorbency ranging from about 0.3 to about 0.6 at 157 nm (using a $F_2$ light source), which minimizes the reflectivity of the film, and thereby effectively reduces standing waves. Accordingly, it will be appreciated that the method of the present disclosure is useful for providing a superior anti-reflective film suitable for use in a microfine photoresist pattern-forming process using a $F_2$ light source at 157 nm.

An embodiment of method for forming a photoresist pattern according to the present disclosure preferably includes a baking process which is conducted between about 150° C. and about 300° C. for about 1 minute to about 5 minutes. Under such conditions, acid is generated from the thermal acid generator, causing the formation of cross-linkage bonds within the anti-reflective film and, thereby producing the desired anti-reflective film that does not dissolve in the photoresist solvent.

Moreover, in accordance with the methods of the present disclosure, an additional baking process(es) can be performed before and/or after the exposure step, preferably, in a range from about 70° C. to about 200° C.

Generally, a $F_2$ light source is employed in the microfine pattern-forming processes of the disclosure. However, the organic anti-reflective coating compositions and photoresist pattern-forming methods using the same can be applied in particular microfine pattern-forming processes using a wide variety of light sources such as ArF, KrF, deep-ultraviolet (DUV) including extreme ultraviolet (EUV), electron beam (E-beam), X-ray or ion beams.

Still another aspect of the present disclosure provides a semiconductor device produced using the photoresist pattern-forming method according to the present disclosure.

The present disclosure will be described in more detail with reference to the following comparative examples and examples, which are merely presented for purposes of illustration and should not be construed to limit the scope of the appended claims.

Absorbance Values of Organic Anti-reflective Films Prepared by Conventional Methods Comparative Example 1

0.13 g of a cross-linking agent having formula 6, 0.26 g of a polyvinyl phenol having formula 2, and 0.085 g of a thermal acid generator having formula 4 were added to and dissolved in 13 g of propylene glycol methyl ether acetate (solvent). The resulting mixture was filtered through a 0.2 µm fine filter to prepare an organic anti-reflective coating composition. The obtained composition was spin-coated onto a silicon wafer, baked at 240° C. for 90 seconds to generate cross-linkage bonds and form an anti-reflective film. The light-absorbency of the obtained anti-reflective film was determined at both 193 nm (using an ArF light source) and 157 nm (using a F2 light source). The absorbance values for the film of this example are provided in Table 1.

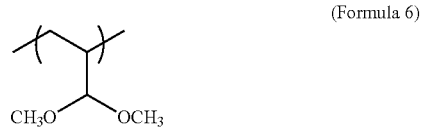

(Formula 6)

Comparative Example 2

The procedure of comparative example 1 was repeated except the amount of polyvinyl phenol was 0.13 g instead of 0.26 g. The light-absorbencies were determined at both 157 nm and 193 nm using F2 and ArF light sources, respectively. The absorbances for the film of this example are also provided in Table 1.

Comparative Example 3

The procedure of comparative example 1 was repeated except the amount of cross-linking agent was 0.26 g instead of 0.13 g and the amount of polyvinyl phenol was 0.13 g instead of 0.26 g. The light-absorbency values were determined at both 157 nm and 193 nm, using F2 and ArF light sources, respectively. The absorbances for the film of this example are also provided in Table 1.

TABLE 1

Light-absorbancies at 157 nm and 193 nm of anti-reflective films prepared by conventional methods.

| Light absorbance | Comparative example 1 | Comparative example 2 | Comparative example 3 |
| --- | --- | --- | --- |
| 157 nm light source | 0.89 | 0.85 | 0.79 |
| 193 nm light source | 0.82 | 0.70 | 0.48 |

Absorbance Values of Organic Anti-reflective Films Prepared by Methods in Accordance with the Disclosure

EXAMPLE 1

0.13 g of a cross-linking agent having formula 6, 0.26 g of a polyvinyl phenol having formula 2, 0.085 g of a thermal acid generator having formula 3, and 0.13 g of a polydimethylsiloxane polymer having formula 1 were added to and dissolved in 13 g of propylene glycol methyl ether acetate (solvent). The resulting mixture was then filtered through a 0.2 µm fine filter to prepare an organic anti-reflective coating composition. The obtained composition was spin-coated onto a silicon wafer, baked at 240° C. for 90 seconds to generate cross-linkage bonds and form an anti-reflective film. The absorbance of the obtained film was determined at 157 nm as above. The absorbance value at 157 nm for the film of this example is provided in Table 2.

EXAMPLE 2

The procedure of example 1 was repeated except the amount of polyvinyl phenol was 0.13 g instead of 0.26 g. The absorbance at 157 nm was determined for the obtained film and is provided in Table 2.

EXAMPLE 3

The procedure of example 1 was repeated except the amount of cross-linking agent was 0.26 g instead of 0.13 g and the amount of polyvinyl phenol was 0.13 g instead of 0.26 g. The light-absorbance for the resultant film was determined at 157 nm and is given in Table 2.

TABLE 2

Light-absorbencies at 157 nm of anti-reflective films prepared by the methods in accordance with the present disclosure

| Light absorbance | Example 1 | Example 2 | Example 3 |
| --- | --- | --- | --- |
| 157 nm light source | 0.54 | 0.48 | 0.58 |

As can be seen from Table 1, organic anti-reflective films prepared by conventional methods require that the relative compositions of cross-linking agent and light-absorbing agent be carefully controlled in order to have a desirable light absorbance between about 0.3 and about 0.6 with respect to a 193 nm ArF light source. The absorbance value of the film of comparative example 3 can be attributed to the relatively low light-absorbency of the cross-linking agent at 193 nm ArF. However, the cross-linking agent and the light-absorbing agent have absorbance values of 0.7 or more with respect to a 157 nm F2 light source, and the absorbances of the anti-reflective films are too high for use in a microfine pattern-forming process with a 157 nm F light source.

On the other hand, the anti-reflective coating compositions according to the present disclosure comprise a polydimethylsiloxane polymer having an absorbance of 0.1 or less of with respect to a 157 nm light source. The anti-reflective coating compositions of the disclosure provide anti-reflective films having a light-absorbency at 157 nm in the preferred range between about 0.3 and about 0.6, and having a minimum reflectivity value. Thus, the coating compositions of the present disclosure provide an anti-reflective film that is efficient in eliminating reflection from the substrate of the photoresist film and removing standing waves, and the films produced therefrom are useful for forming quality photoresist patterns.

Additionally, the present disclosure provides organic anti-reflective films which are useful in microfine pattern-forming processes that use a 157 nm F2 light source. Microfine pattern-forming processes that use a 157 nm F2 light source are expected to be the principle process for forming photoresist patterns in the future.

It is further understood by those skilled in the art that the foregoing description provides preferred embodiments of the organic anti-reflective compositions and methods for forming a photoresist pattern disclosed herein. Various changes and modifications may be made to the disclosure without departing from the spirit and scope thereof.

What is claimed is:

1. An organic anti-reflective coating composition comprising: a cross-linking agent; a light-absorbing agent having a high light-absorbency within a wavelength range of an exposure light source; a thermal acid generator; an organic solvent; and a polydimethylsiloxane polymer having a structure in accordance with formula 1:

(Formula 1)

wherein the polydimethylsiloxane polymer has a weight average molecular weight between about 14,000 grams per mol (g/mol) and about 21,000 g/mol.

2. The composition according to claim 1, wherein the light-absorbing agent comprises a polyvinyl phenol polymer having a structure in accordance with formula 2:

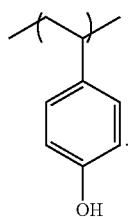

(Formula 2)

3. The composition according to claim 1, wherein the cross-linking agent comprises a polymer having a weight average molecular weight ranging from about 3000 grams per mol (g/mol) to about 100,000 g/mol and a structure in accordance with formula 3:

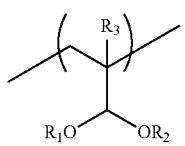

(Formula 3)

wherein $R_1$, and $R_2$ are each independently a $C_1$–$C_{10}$ alkyl group, straight chain or branched; and $R_3$ is a hydrogen or methyl group.

4. The composition according to claim 1, wherein the thermal acid generator comprises 2-hydroxycyclohexyl p-toluenesulfonate having a structure in accordance with formula 4:

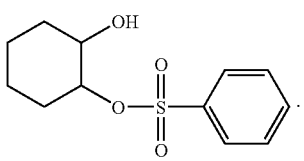

(Formula 4)

5. The composition according to claim 2, wherein the polyvinyl phenol polymer is contained in an amount of about 50 weight percent (wt. %) to about 400 wt. %, based on the amount of the cross-linking agent.

6. The composition according to claim 4, wherein the thermal acid generator is contained in an amount of about 10 wt. % to about 200 wt. %, based on the amount of the cross-linking agent.

7. The composition according to claim 1, wherein the organic solvent is contained in an amount of about 1000 wt. % to about 10,000 wt. %, based on the total amount of the cross-linking agent and the light-absorbing agent.

8. The composition according to claim 1, wherein the polydimethylsiloxane polymer is contained in an amount of about 20 wt. % to about 100 wt. %, based on the total amount of the cross-linking agent and the light-absorbing agent.

9. The composition according to claim 1, further comprising an acid-diffusion inhibitor.

10. The composition according to claim 9, wherein the acid diffusion inhibitor comprises (18-crown-6(1,4,7,10,13,16-hexaoxacyclooctadecane) having a structure in accordance with formula 5:

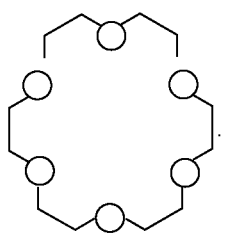

(Formula 5)

11. The composition according to claim 9, wherein the molar ratio of acid-diffusion inhibitor to thermal acid generator is between about 0.30 and about 5.0.

* * * * *